United States Patent

Elmore

[15] 3,668,082

[45] June 6, 1972

[54] METHOD FOR STRONGLY ADHERING A METAL FILM ON EPOXY SUBSTRATES

[72] Inventor: Glenn V. Elmore, Vestal, N.Y.

[73] Assignee: International Business Machines Corporation, Armonk, N.Y.

[22] Filed: Dec. 7, 1970

[21] Appl. No.: 95,939

[52] U.S. Cl. ..............................204/30, 117/47 A, 252/79.5

[51] Int. Cl. ..............................C23b 5/64

[58] Field of Search....................204/20, 22, 30; 117/47 A; 156/2; 252/79.5

[56] References Cited

UNITED STATES PATENTS 3,305,460 2/1967 Lacy..............................204/30

*Primary Examiner*—John H. Mack
*Assistant Examiner*—W. I. Solomon
*Attorney*—Hanifin and Jancin and Hansel L. McGee

[57] ABSTRACT

An epoxy board is prepared for metal plating by dipping the same in a molten eutectic comprising 60% KOH and 40% NaOH. The epoxy board is then rinsed and neutralized, after which it is sensitized and activated conventionally and immersed in an electroless deposition bath for metal plating thereon. The resultant metal film is found to be strongly bonded to the epoxy board.

7 Claims, No Drawings

METHOD FOR STRONGLY ADHERING A METAL FILM ON EPOXY SUBSTRATES

BACKGROUND OF THE INVENTION

1. Field of the Invention

The present invention is directed to a method for effecting a strong metal to epoxy bond. More specifically, the invention is directed to a method of treating an epoxy printed circuit board with a molten alkali metal hydroxide eutectic prior to the deposition of a metal film thereon.

2. Prior Art

Epoxy impregnated fiber glass bands are presently being used as printed circuit boards, either single layered or as laminates. In the preparation of printed circuitry, it is of the utmost importance that metal disposed upon the substrate or board adhere strongly thereto. In all of the prior art while it is possible to plate a film of metal on epoxy boards, it is impossible to provide any substantial amount of adherence between the film of metal and the epoxy board. That is, in nearly every case the metal film is readily peeled from the surface of the epoxy by using a very unsubstantial amount of force and in some instances the metal film actually falls off of the surface of the epoxy board in the electroplating solution. This lack of adhesion is partially due to the face that in all prior roughening methods the material at the surface of the epoxy board is damaged and weakened, thus even though a good mechanical bond is obtained the surface of the epoxy easily breaks away thereby greatly lowering the force required to peel the metal film from the plastic surface. In some instances by utilizing a B stage epoxy, some relatively good adherence has been obtained after further curing of the epoxy. However, this adherence is very unpredictable, costly and time-consuming.

Generally, the prior art teaches as one step in the metalization of an epoxy board the need for cleaning the epoxy board in an alkaline cleaner prior to electroless deposition. For example, U. S. Pat. No. 3,436,233 shows epoxy boards which are cleaned prior to electroless plating with copper to make a better circuit. U. S. Pat. No. 3,099,576 shows the use of hot NaOH or KOH solution to clean a substrate prior to electroless plating. In this patent the purpose of alkaline treatment is to improve adhesion of gold. U. S. Pat. No. 3,305,460 teaches the cleaning treatment of epoxy resins, vinyl resins, phenolic resins and the like by alkali solution immersion in order to improve adhesion of electroplated metal on a non-conductive plastic surface. U. S. Pat. No. 3,416,992 shows electrode deposited copper on epoxy resins and emphasizes the requirement for cleaning the plastic substrate prior to sensitizing the surface for electroless copper deposition. U. S. Pat. No. 2,197,439 similarly shows an epoxy resin laminate metalized with copper and like the prior art, stresses the importance of cleaning the epoxy resin with alkaline cleaning agents prior to deposition. All of the prior art discloses methods using additional treatment of the substrate in addition to the alkaline cleaning step.

None of the prior art discloses or suggests the treatment of an epoxy resin board with a molten eutectic prepared from KOH and NaOH only, prior to metal deposition.

SUMMARY OF THE INVENTION

There is provided a method for the metal deposition on epoxy boards which includes the treating of the surface of an epoxy board with a molten alkali metal hydroxide eutectic prior to metal deposition. Stepwise, the method is comprised of immersing the epoxy board in molten alkali metal hydroxide eutectic comprising 60% by weight KOH and 40% by weight NaOH for about 5 minutes. The board is then cooled and rinsed in water and neutralized with a dilute acid and again rinsed in water. The so-treated board is thereafter sensitized with a conventional sensitizing solution and activated with a noble metal salt such as palladium chloride and is immersed in an electroless metal plating bath to deposit a strongly adhering metal onto the surface of the epoxy board. Films having peel strength of about 5 lb. to 10 lb./inch are obtained by this treatment as opposed to peel strength of 0.2 lb./inch or less obtained from prior art methods of treating epoxy surfaces.

OBJECTS OF THE INVENTION

It is an object of the invention to provide a method for strongly bonding a metal to an epoxy board. It is another object of the invention to provide a novel method for treating the surface of an epoxy board prior to metal deposition thereon.

It is a further object of the invention to provide a method which is featured by the step of treating the surface of an epoxy board with a molten alkali metal hydroxide eutectic.

PREFERRED EMBODIMENT OF THE INVENTION

In accordance with conventional electroless copper plating methods, a substrate is suitably cleaned in an aqueous alkaline solution. The cleaned substrate can be sensitized in a variety of media. A preferred sensitizing solution is an aqueous composition containing 160–165 grams of stannous chloride dihydrate, 170–175 cc of reagent grade hydrochloric acid, and 1 gallon of distilled water. This sensitizing solution should be maintained at a temperature of from 70°–80° F. The substrate is immersed in this solution for 5 to 7 minutes. It is contemplated that the substrate may also be sensitized by immersing them in the following types of solutions: an aqueous hydrochloric acid solution of titanium trichloride; an aqueous ammonium hydroxide solution of silver nitrate; an aqueous solution of hydroquinone and ethanol; and an aqueous composition of stannous fluoroborate and free fluoroboric acid.

Following the sensitizing treatment, the substrate is rinsed in water and immersed in an activating solution, the purpose of which is to deposit a film of a seeding metal onto the substrate. The preferred activating solutions will deposit either gold, silver or palladium. An activating composition is prepared by adding 0.3 to 2 grams of $PdC1_2{\cdot}2H_2O$, dissolved in a distilled or deionized water, to 40 to 160 cc of concentrated reagent grade HCl. This solution will be maintained at a temperature of from 70° to 80° F. The substrate is immersed in this solution for 2 to 4 minutes.

Thereafter, the substrate is immersed in the plating bath comprising, for example, an aqueous solution containing a salt of copper and an alkali metal hydroxide in the presence of salts such as potassium sodium tartrate, and/or sodium carbonate. The substrate is immersed for a time sufficient to form a conductive coating.

The instant invention may be carried out by using any conventional aqueous electroless metal plating bath solution, for example, a nickel or copper electroless bath may be used.

An example of one suitable copper plating bath is as follows:

| COMPONENT | LOWER LIMIT | UPPER LIMIT |
|---|---|---|
| Copper sulfate pentahydrate | 165 g/gal. | 175 g/gal. |
| Formaldehyde (37%) | 1880 ml/gal. | 1900 ml/gal. |
| Nickel chloride hexahydrate | 63 g/gal. | 72 g/gal. |
| Sodium hydroxide | 152 g/gal. | 162 g/gal. |
| Rochelle salts | 695 g/gal. | 710 g/gal. |
| Sodium carbonate | 68 g/gal. | 77 g/gal. |

A typical electroless Ni bath may be prepared as follows:

| | |
|---|---|
| $2\ NiCo_3{\cdot}3\ Ni(OH)_2\ 4H_2O$ | 10 g/l |
| HF (as 50% HF) | 6 ml/l |
| Citric acid | 5.5 g/l |
| $NH_4HF_2$ | 10 g/l |
| $NaH_2PO_2{\cdot}H_2O$ | 20 g/l |
| $NH_4OH$ | 30 ml/l |
| pH | 4.5–6.8 |
| Temperature | 170–180°F. |

The epoxy boards may be prepared from any epoxy resin. Typically, an epoxy resin formulation is shown in U.S. Pat. No. 3,523,037 to Leroy N. Chellis. The epoxy resin formulation and the method of preparing epoxy boards disclosed in the above said patent is herein incorporated. For example, for the purposes of this invention, a glass fabric was impregnated with a composition consisting of, brominated epoxy resin, 90 parts per hundred by weight of resin solids, tetrafunctional epoxy resin, 10–30 parts per hundred by weight of resin solids, dicyandiamide, 3–4 parts per hundred by weight, tertiary amine, 0.2–0.4 parts per hundred by weight, and ethylene glycol monomethylether, 40 parts by weight was dissolved in sufficient methylethyl ketone to impart a specific gravity of about 1.085 ± 0.005 to the composition as described in U. S. Pat. No. 3,523,037. The glass fabric is heated in stages to a final temperature of 300° to 350° F. until the desired phase of partial cure is obtained. The partially cured prepeg sheets are laminated together in a press at about 50 psi to about 2,000 psi at a temperature of 340° to 350° F for a period of from 30 to 120 minutes.

Typically, the method of this invention may be carried out as follows:

An epoxy board or substrate as prepared above or with the use of other epoxy compositions, is immersed into a container containing a molten alkali metal hydroxide eutectic comprising about 60 percent KOH and about 40 percent NaOH. The temperature of the molten eutectic is maintained in a range of about 167° to about 300° C. A more preferred temperature range is from about 200° to about 230° C. The epoxy substrate is permitted to remain in the molten eutectic for about 1 to about 2 minutes. It is thereafter rinsed with water to remove the alkali metal hydroxide. The epoxy substrate is then sensitized with a conventional sensitizing agent, and activated with a catalytic metal such as the noble metals, as indicated hereinabove. Conventionally, palladium chloride is used. The so treated epoxy substrate is then immersed in a conventional metal electroless plating bath such as hereinabove described for about 20 minutes. It was found that a well adhered copper coating of about 0.00025 inches thick was deposited on the epoxy board. It is then immersed in a conventional electrolytic metal bath for a time sufficient to deposit a metal film of desired thickness. After removing the substrate from the electrolytic plating bath, it is heated for about 5–30 minutes at about 170°, to about 190° C. It should be readily understood that other temperatures can be used for differing periods of times. It is readily apparent that lower temperatures can be used for longer periods of time and vice versa. Bond strengths of from about 5 to 10 lbs/inch as determined by the 90° peel test are achieved.

A more specific example of the invention is illustrated by the following sequence of steps:

1. Immersing the epoxy substrate in a melt consisting of about 60 percent KOH and about 40 percent NaOH, said melt being maintained at a temperature of about 225° C. for about 1 minute to about 2 minutes.
2. Rinsing the epoxy substrate with water to remove the alkali metal hydroxide therefrom.
3. Sensitizing and activating the substrate and thereafter immersing the same in an electroless copper solution for about 20 minutes.
4. Removing the substrate from the electroless copper solution and immersing the same in a conventional electrolytic copper bath sufficient time to obtain a film having a desired thickness.
5. Heating the copper plated epoxy substrate for about 15 minutes at a temperature of about 170° C.

For the purposes of comparison with the prior art, an epoxy board was immersed in a 20 percent sodium hydroxide solution maintained at a temperature of about 80° C. for approximately 2 to 5 minutes. It was then rinsed in water, sensitized and activated and then immersed into an electroless copper solution and electroplated as above, and is heated for 15 minutes at 100° C. The copper film thus deposited was easily peeled from the epoxy board. It is estimated that bonds having peel strength of 0.2 lbs./inch or less as determined by the 90° peel test, were achieved.

What is claimed is:

1. In a method for depositing a strongly adhering layer of metal on the surface of an epoxy board comprising the steps of:

a. immersing the epoxy substrate in a alkali metal hydroxide eutectic melt, b. removing said epoxy board from said eutectic melt and rinsing the same in water, c. sensitizing and activating the surface of said epoxy board, and thereafter immersing said activated epoxy board in an electroless metal plating bath for a time sufficient to deposit a strongly adhering metal layer thereon, said strongly adhering metal layer having a peel strength of about 5 lb/inch to about 10 lb/inch.

2. In a method according to claim 1 wherein said alkali metal hydroxide eutectic melt consists of 60% by weight KOH and 40% by weight NaOH.

3. In a method according to claim 1 wherein said eutectic melt is maintained at a temperature between 167° to about 300° C.

4. In a method according to claim 1 wherein said alkali metal hydroxide eutectic melt is maintained at a temperature of about 200° C. to about 230° C.

5. In a method according to claim 1 wherein said epoxy board is immersed in said alkali metal hydroxide eutectic for about 1 minute to about 2 minutes.

6. In a method according to claim 1 wherein there is added the additional step of immersing said epoxy board in an electrolytic metal plating bath for a time to deposit a film of desired thickness and thereafter heating said metal coated epoxy board for about 5 minutes to about 30 minutes at a temperature of about 170° C. to about 190° C.

7. In a method according to claim 6 wherein said metal coated epoxy board is heated for 15 minutes at a temperature of 170° C.

* * * * *